United States Patent
Schillaci et al.

(10) Patent No.: US 6,727,838 B2
(45) Date of Patent: Apr. 27, 2004

(54) TRACKING ANALOG-TO-DIGITAL CONVERTER

(75) Inventors: Luca Schillaci, Belgoioioso (IT); Alessandro Scrivani, Piacenza (IT); Simone Silvestri, Pavia (IT); Maurizio Nessi, Como (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 63 days.

(21) Appl. No.: 10/254,371

(22) Filed: Sep. 25, 2002

(65) Prior Publication Data

US 2003/0058151 A1 Mar. 27, 2003

(30) Foreign Application Priority Data

Sep. 26, 2001 (IT) ...................................... MI2001A1996

(51) Int. Cl.⁷ ............................ H03M 1/34; H03M 3/00
(52) U.S. Cl. ....................................... 341/164; 341/143
(58) Field of Search ................................ 341/155, 139, 341/143, 118, 120, 158, 159, 164; 327/307

(56) References Cited

U.S. PATENT DOCUMENTS 5,821,795 A * 10/1998 Yasuda et al. ............... 327/307
5,945,934 A * 8/1999 De Los Santos ............ 341/139
6,456,220 B1 * 9/2002 Leung et al. ................ 341/155

* cited by examiner

*Primary Examiner*—Patrick Wamsley
(74) *Attorney, Agent, or Firm*—Lisa K. Jorgenson; Jose Gutman; Fleit, Kain, Gibbons, Gutman, Bongini & Bianco P.L.

(57) ABSTRACT

The present invention herein describes a tracking analog-to-digital converter, in particular of the differential input type.

In an embodiment thereof the tracking analog-to-digital converter, having a differential analog input including a first analog input and a second analog input, and a digital output at a first number of bits comprising: a back and forth counter having a direction input and an output, with a second number of bits; a digital-to-analog converter having a data input coupled to said output of said converter, a reference input and an output, with a second number of bits; a first comparator having a positive input, a negative input coupled to said output of said digital-to-analog converter and an output coupled to said direction input; characterized in that said reference input is coupled to said first analog input and said positive input of said first comparator is coupled to said second analog input.

5 Claims, 4 Drawing Sheets

TRACKING ANALOG-TO-DIGITAL CONVERTER

The present invention refers to a tracking analog-to-digital converter, in particular of the differential input type.

A differential input tracking analog-to-digital converter comprises a differential amplifier to which the input terminals are applied. The output of the differential amplifier is placed in input to a comparator whose output is applied to the input of a back and forth counter (or up-down). The output of the back and forth counter, that corresponds to the output of the analog-to-digital converter, is applied to the input of a digital-to-analog converter. The output of the digital-to-analog converter is connected to the other input of the comparator.

The comparator compares the signal at the output of the differential amplifier with the signal at the output of the digital-to-analog converter, and its output commands the back and forth counter. If for example the value of the signal at the output of the differential amplifier is greater than the value of the output of the digital-to-analog converter, the counter continues increasing until the signal coming from the digital-to-analog converter exceeds that of the differential amplifier. At this point the output signal of the comparator changes value and the counter decreases its value. Consequently, the signal at the output of the digital-to-analog converter again returns higher than the signal at the output of the differential amplifier, therefore the counter increases its value and continues to oscillate around its input value until the input signal varies.

In view of the state of the technique described, an object of the present invention is to provide for a tracking analog-to-digital converter, in particular of the differential input type, which is easier to produce and has a reduced number of circuit elements.

In accordance with the present invention, these and other objects are reached by means of a tracking analog-to-digital converter, having a differential analog input including a first analog input and a second analog input, and a digital output with a first number of bits comprising: a back and forth counter having a direction input and an output, with a second number of bits; a digital-to-analog converter having a data input coupled to said output of said converter, a reference input and an output, with a second number of bits; a first comparator having a positive input, a negative input coupled to said output of said digital-to-analog converter and an output coupled to said direction input; characterized in that said reference input is coupled to said first analog input and said positive input of said first comparator is coupled to said second analog input.

These objects are also reached by means of a tracking analog-to-digital converter, having a differential analog input including a first analog input and a second analog input, and a digital output with a first number of bits comprising: a back and forth counter having a direction input and an output, with a second number of bits; a digital-to-analog converter having a data input coupled to said output of said converter, a reference input and an output, with a second number of bits; a first comparator having a positive input, a negative input coupled to said output of said digital-to-analog converter and an output coupled to said direction input; characterized in that said first analog input and said second analog input are coupled to the inputs of a second comparator that produces in output a signal corresponding to the sign of the signal of said differential analog input; said first analog input and said second analog input are selectively coupled to said positive input of said first comparator and selectively coupled on the contrary to said reference input.

These objects are further reached through a method for carrying out an analog-digital conversion of a differential signal by means of a tracking converter comprising a comparator coupled to a back and forth counter and a digital-to-analog converter that takes the output signal of said counter and couples it to an input of said comparator, characterized in that the difference of said differential input signal is carried out by the combination of said comparator and said digital-to-analog converter.

The characteristics and the advantages of the present invention will appear evident from the following detailed description of an embodiment thereof, illustrated as non-limiting example in the enclosed drawings, in which.

Figure 1:
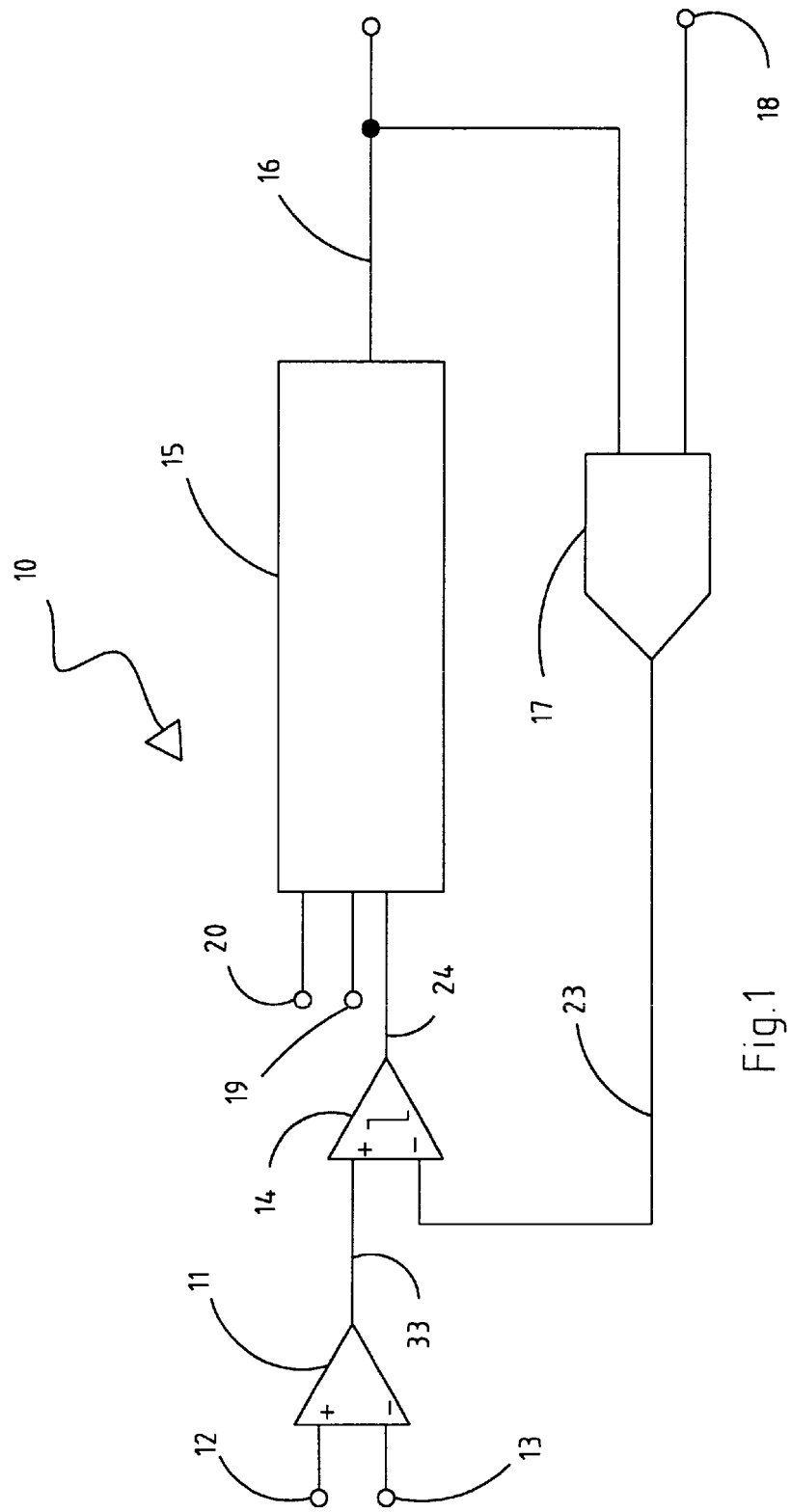
FIG. 1 represents a differential input tracking analog-to-digital converter in accordance with the known art.

A differential input tracking analog-to-digital converter 10 in accordance with the known art is shown in FIG. 1, that comprises a differential amplifier 11 to which the input terminals 12 and 13 are applied, respectively positive input 12 and negative input 13. The output of the differential amplifier 11 is applied to the positive input 33 of a comparator 14 whose output 24 is applied to the direction input of a back and forth counter (or up-down) 15. The output 16 of the back and forth counter 15, that also corresponds to the output of the analog-to-digital converter 10, is applied to the input of a digital-to-analog converter 17. The output 23 of the digital-to-analog converter 17 is connected to the negative input of the comparator 14. The digital-to-analog converter 17 also has a terminal 18 to which a fixed external reference voltage is applied. The analog-to-digital converter 15 also has two other inputs one 19 for zeroing and one of clock 20.

The differential input tracking analog-to-digital converter 10 represented in FIG. 1 has a resolution, in bits, equal to the number of bits of the counter 15 and of the digital-to-analog converter 17.

Figure 2:
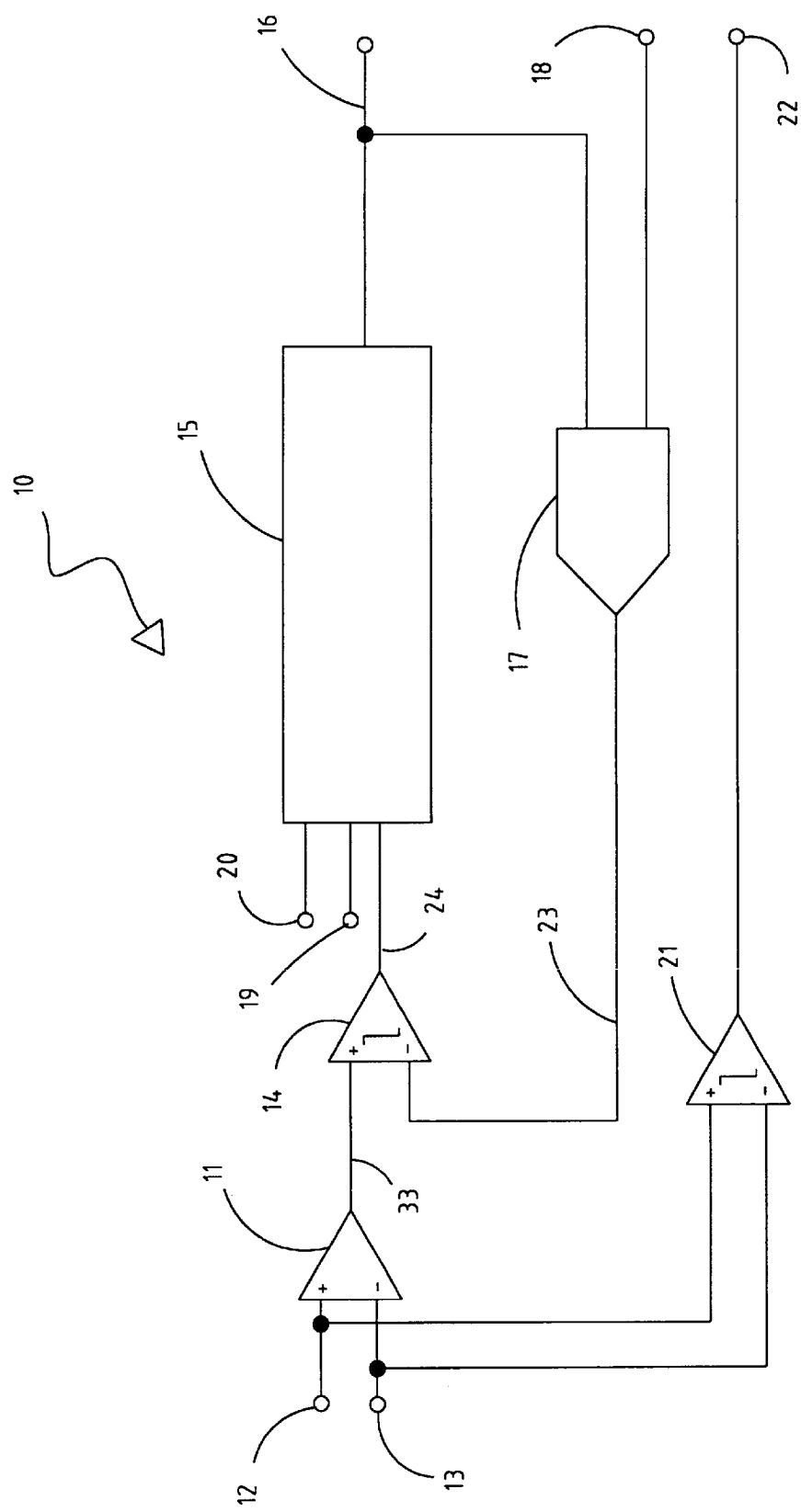
FIG. 2 represents an embodiment of a differential input tracking analog-to-digital converter.

FIG. 2 represents an embodiment of a differential input tracking analog-to-digital converter. In this case, besides the elements already described in FIG. 1, that have the same numerical references, a sign comparator 21 is present that produces at its output 22 the sign of the signal present at the input terminals 12 and 13. With the circuit represented in FIG. 2 if the differential input tracking analog-to-digital converter 10 has a resolution of N bits, the counter 15 and the digital-to-analog converter 17 with a resolution of N−1 bit are used. In fact at the output 16 there will be the digital value with N−1 bit and at the output 22 there will be the further bit indicating the sign of the signal present at the input terminals 12 and 13.

Using the counter 15 and the digital-to-analog converter 17 with a resolution of N−1 bit, a simpler analog-to-digital converter 10 is obtained that occupies an area (on a wafer) of lower dimensions, practically halved, in comparison to that occupied by an analog-to-digital converter 10 like that in FIG. 1. The conversion time is reduced (because a digital-to-analog converter 17 of N−1 bit is used) and the dynamics of the digital-to-analog converter 17 are also halved.

Figure 3:
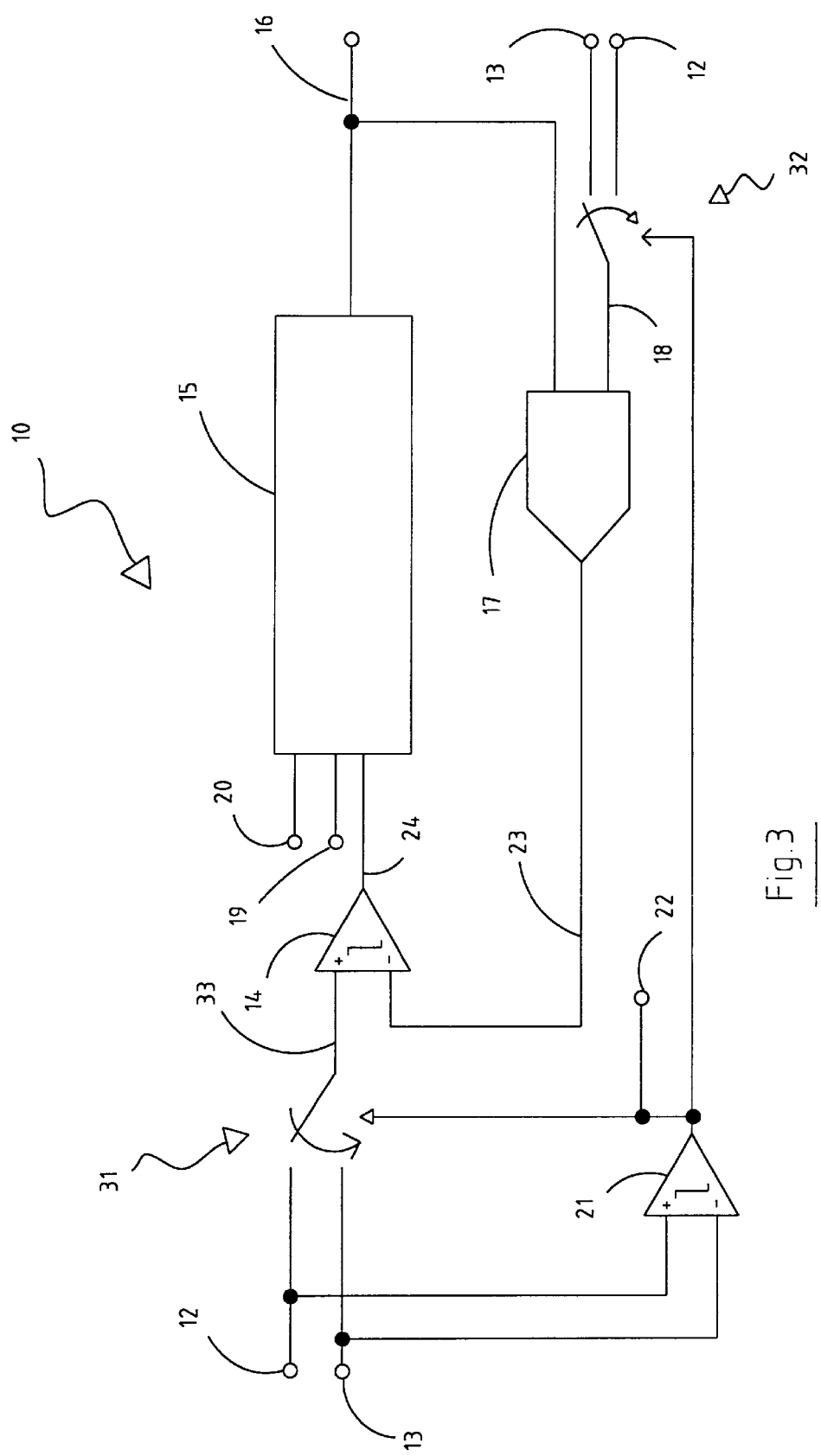
FIG. 3 represents another example of an embodiment of a differential input tracking analog-to-digital converter.

FIG. 3 represents another example of an embodiment of a differential input tracking analog-to-digital converter 10.

In this case, in comparison with the elements already described in FIG. 2, that give the same numerical references, the differential amplifier 11 is not present.

The input terminals 12 and 13 are selectively coupled to the positive input 33 of the comparator 14, by means of a switch 31 commanded by the sign of the signal present at the input terminals 12 and 13 and present at the output 22 of the sign comparator 21. In the event the output 22 is equal to 0 the terminal 12 is connected to the input 33, in the event the output 22 is equal to 1 the terminal 13 is connected to the input 33.

At the terminal 18 of the digital-to-analog converter 17, a fixed external reference voltage is not applied in this case, but the input terminals 12 and 13 are selectively coupled by means of a switch 32, commanded by the sign of the signal present at the input terminals 12 and 13 and present at the output 22 of the sign comparator 21. In the event the output 22 is equal to 0 the terminal 3 is connected to the terminal 18, in the event the output 22 is equal to 1 the terminal 2 is connected to the terminal 18.

Also in this case, if the differential input tracking analog-to-digital converter 10 has a resolution of N bits, the counter 15 and the digital-to-analog converter 17 with a resolution of N−1 bit are used. In addition, the circuit is further simplified as the differential amplifier 11 is no longer present; with the addition of only two commanded switches.

Figure 4:
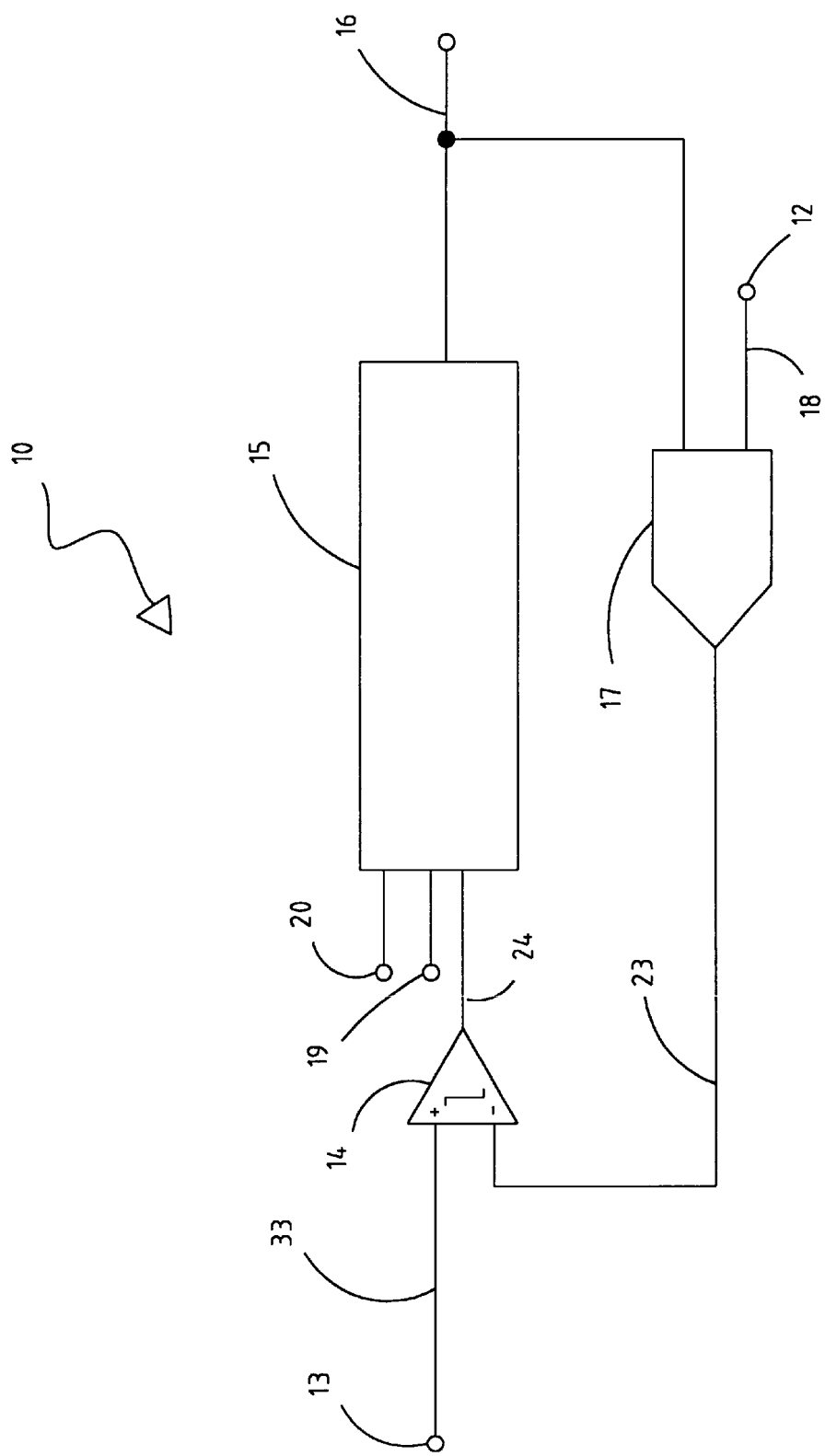
FIG. 4 represents a variant of the differential input tracking analog-to-digital converter in FIG. 3.

FIG. 4 represents a variant of the differential input tracking analog-to-digital converter 10 in FIG. 3. In this case the input 13 is applied directly to the positive input 33 of the comparator 14, and the input 12 is applied directly to the terminal 18 of the digital-to-analog converter 17. In this circuit the sign comparator 21 is not present, but the differential input tracking analog-to-digital converter 10 has a resolution, in bits, equal to the number of bits of the counter 15 and of the digital-to-analog converter 17. To prevent the converter 10 from malfunctioning the signal to the input terminal 12 (positive) must be greater than the signal to the input terminal 13 (negative).

In the circuits in FIGS. 3 and 4 the difference of the input signals is carried out without having to use a differential amplifier 11.

The signal in input to the comparator 14 to make the conversion required must be:

$$INP-INM-VDAC=INP-(VDAC+INM)$$

for $$INP-INM>0(\text{sign bits at 0});$$

$$INM-INP-VDAC=INM-(VDAC+INP)$$

for $$INP-INM<0(\text{sign bits at 1});$$

where

INM represents the signal at the terminal 12;

INP represents the signal at the terminal 13;

VDAC represents the signal at the output of the digital-to-analog converter 17.

In order that the above described situation occurs, in the circuit in FIG. 3 the sign bit (output 22) is used to commutate between INP (sign=0) and INM (sign=1) the input of the comparator and to commutate between INM (sign=0) and INP (sign=1) the terminal 18 of the digital-to-analog converter 17.

What is claimed is:

1. Tracking analog-to-digital converter, having a differential analog input including a first analog input and a second analog input, and a digital output at a first number of bits comprising:

a back and forth counter having a direction input and an output, with a second number of bits;

a digital-to-analog converter having a data input coupled to said output of said converter, a reference input and an output, with a second number of bits;

a first comparator having a positive input, a negative input coupled to said output of said digital-to-analog converter and an output coupled to said direction input;

characterized in that said reference input is coupled to said first analog input and said positive input of said first comparator is coupled to said second analog input.

2. Tracking analog-to-digital converter in accordance with claim 1 characterized in that said first analog input and said second analog input are coupled to the inputs of a second comparator that produces in output a signal corresponding to the sign of the signal of said differential analog input; said first analog input and said second analog input are selectively coupled to said positive input of said first comparator and selectively inverted coupled to said reference input.

3. Tracking analog-to-digital converter in accordance with claim 2 characterized in that said first analog input and said second analog input are selectively coupled to said positive input by means of a first switch commanded by said sign of the signal of said differential analog input and are selectively inverted coupled to said reference input by means of a second switch commanded by said sign of the signal of said inverted differential analog input.

4. Tracking analog-to-digital converter in accordance with claim 2 characterized in that said first number of bits corresponds to said second number of bits plus 1.

5. Tracking analog-to-digital converter in accordance with claim 1 characterized in that said first number of bits corresponds to said second number of bits.

* * * * *

UNITED STATES PATENT AND TRADEMARK OFFICE
CERTIFICATE OF CORRECTION

PATENT NO. : 6,727,838 B2  
DATED : April 27, 2004  
INVENTOR(S) : Luca Schillaci et al.

It is certified that error appears in the above-identified patent and that said Letters Patent is hereby corrected as shown below:

<u>Title page,</u>  
Item [75], Inventors, change "Belgoioioso" to -- Belgioioso --

Signed and Sealed this

Twenty-fourth Day of August, 2004

JON W. DUDAS  
*Director of the United States Patent and Trademark Office*